United States Patent [19]

Noble

[11] Patent Number: 5,258,621

[45] Date of Patent: Nov. 2, 1993

[54] COLD SHIELD FOR A SCANNED LINEAR IR DETECTOR ARRAY

[75] Inventor: Milton L. Noble, Liverpool, N.Y.

[73] Assignee: General Electric Company, Syracuse, N.Y.

[21] Appl. No.: 840,524

[22] Filed: Feb. 25, 1992

[51] Int. Cl.⁵ .......................................... H01L 31/024
[52] U.S. Cl. ................................. 250/352; 250/332; 250/370.15
[58] Field of Search .................. 250/352, 370.15, 332, 250/334, 349

[56] References Cited

U.S. PATENT DOCUMENTS

4,431,918  2/1984  White .............................. 250/338.1
4,914,299  4/1990  Jungkman et al. ................ 250/352
5,075,553  12/1991 Noble et al. ...................... 250/352

Primary Examiner—Paul M. Dzierzynski
Assistant Examiner—Richard Hanig
Attorney, Agent, or Firm—Paul Checkovich; Stephen A. Young

[57] ABSTRACT

An improved cold shielding arrangement for a scanned linear IR detector array normally having the pixels arranged in plural columns, is disclosed. The arrangement consists of a first slotted cold shield plate spaced from the array and designed to reduce the angular field of view for all pixels of the array in the scanning direction, and a composite cold shield in proximity to the individual pixels. The first part of the composite cold shield is a thicker plate, typically several mils thick having slots oriented to reduce the angular field of view in the resolution direction for the pixels in a common row. The second part of the composite cold shield is a thinner, top plate providing small apertures which further define the angular field of view in the resolution direction, and in certain cases also define the angular field of view in the scanning direction. The first part of the composite cold shield may be fabricated of oriented silicon which may be preferentially etched to form small slots with vertical walls, while the second part of the composite cold shield may also be of silicon (typically 1 mil thick) with an opaque coating with photolithographically patterned apertures in a low reflectance, optically black film.

9 Claims, 5 Drawing Sheets

FIG. 5A. PIXEL ANGULAR FIELD IN RESOLUTION DIRECTION

FIG. 5B PIXEL ANGULAR FIELD IN OPTICAL SCAN DIRECTION

COLD SHIELD FOR A SCANNED LINEAR IR DETECTOR ARRAY

BACKGROUND OF THE INVENTION

1. Field of the Invention

The invention relates to scanned linear IR detector arrays maintained at cryogenic temperatures and more particularly to the provision of an improved cold shield for such arrays.

2. Prior Art

Effective cold shields are required for infrared detector arrays to limit the unfocused background illumination incident on the array. With line arrays, the simplest approach is to locate the IR array in a cold shielded enclosure with a long narrow slot as an optical entrance aperture to hold the unfocused radiation to a minimum compared with the focused radiation from the scene. When the optics are of low speed, i.e. high F/#, this simple approach is very effective. When the optics are required to be "fast", i.e. of low F/#, and the detector array is long, the slot must be made wide to match the focused optical cone and then considerable unfocused background illumination can fall on the IR detector, which seriously degrades the signal to background, and accordingly the dynamic range and system sensitivity.

When a fast optical system is employed to obtain high sensitivity, in a scanning infrared sensor it is more difficult to maintain high cold shielding efficiency. Cold shielding efficiency may be defined as the ratio of focused to unfocused radiation incident on the IR detector. The problem posed with wider beam-angle optics is that they force wider and longer cold shield entrance slot and thus expose the IR detector pixels to larger areas of relatively high temperature IR radiating surfaces. Such surfaces include dewar parts, the internal barrels of the optics and to a lesser degree the optical elements themselves. The unfocused background of individual photo detectors in long IR detector arrays, which forces a long entrance slot, can have a background angular field of view approaching a hemisphere in the resolution direction. An ideal cold shield prevents IR background radiation lying outside the focused angular field of view from reaching the individual photodetectors.

Additionally, when a linear array has plural parallel columns causing an increase in the width of the array, the simple slot cold shield admits more unfocused background light in the optical scan direction. A linear array can employ additional columns of pixels in the scan direction for several reasons. Sensor signal/noise can be increased by a time delay and integrate (TDI) operation in which multiple looks from multiple pixels at the same resolution position are combined after suitable time delays to equalize the viewing angle. Another reason is to provide redundant pixels at each resolution position, the best of two or more being selected to overcome bad or poor performance pixels. A third reason is to achieve overlapped pixels at a small pitch with increased resolution by providing additional columns in which the pixels in adjacent columns are displaced in the optical scan direction.

Achieving these objectives has called for additional cold shielding means beyond that available from a simple slotted cold shield. The additional cold shielding has taken the form of cold shields close to the pixels on the detector arrays which affect the viewing angle of either individual pixels or small sets of pixels.

A cold shield which operates at the pixel level for two column staggered element line arrays is described in the U.S. Pat. No. 5,075,553 of M. L. Noble et al filed Oct. 23, 1989. In that patent, a cold shielding arrangement is disclosed for use with either an individual staggered pixel linear IR array or a staggered arrangement of such arrays. The cold shielding arrangement first includes a slotted cold plate. An individual slot is provided for each sub-array on the focal plane, which restricts the field of view of all of the pixels of that array in the optical scanning direction. In addition, a pair of interdigitated cold shields are set on the surface of each array in close proximity to the pixels to restrict the field of view of each individual pixel in the cross optical scan or resolution direction.

The interdigitated pixel level cold shields in the cited patent consist of two comb-like members typically of silicon or alumina formed by micro- machining, one arranged with the frame of the comb arranged outside of one row of pixels and the other arranged with the frame of the comb arranged outside of the second row of pixels. The solution is suitable for two rows of pixels, but is not readily applied to more than two rows of pixels.

SUMMARY OF THE INVENTION

Accordingly, it is an object of the present invention to provide in an IR sensor, improved cold shielding means for a linear array. The approach herein described is applicable to arrays in which the pixels are arranged in at least one column but has increased advantage with larger numbers of columns. It is also applicable to arrangements in which there are more than one array of the above design arranged in a staggered sequence.

In accordance with the invention, the cold shielding arrangement comprises three cold shields. The first cold shield is the above described cold shield plate, with an elongated slot, spaced from the linear array to intercept radiation exceeding the focused pixel angular field measured in the optical scanning direction for all pixels of the array. The second and third cold shields are supported in close proximity to the pixels thus forming a composite pixel-level cold shield.

The first part of the composite cold shield has successive walls disposed between pixels at successive positions in columns of pixels erected on a surface proximate to the plane of the pixels. The walls are sufficiently high to exclude radiation significantly exceeding the focused pixel angular field measured in the resolution direction.

The second part of the composite cold shield is an apertured plate having one aperture for each pixel or group of pixels disposed upon the first cold shield part and aligned with the openings between the walls to exclude radiation exceeding the focused pixel angular field in both the resolution and scanning direction.

More particularly, the first part of the composite cold shield consists of a silicon plate, typically 5 mils in thickness, spaced approximately 1 mil off the array and containing a set of preferentially etched slots for the pixels at each position in a column (i.e. for all pixels in the same skewed row). This slot restricts the angular fields of view in the resolution direction. The second part of the composite cold shield is an apertured plate, placed on top of the multiple slotted, first part. The second part is a thin (nominally 1 mil) optically transmissive plate, such as silicon, having a low reflectance opaque coating patterned to provide transparent apertures.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

DESCRIPTION OF THE PREFERRED EMBODIMENT

Figure 1:
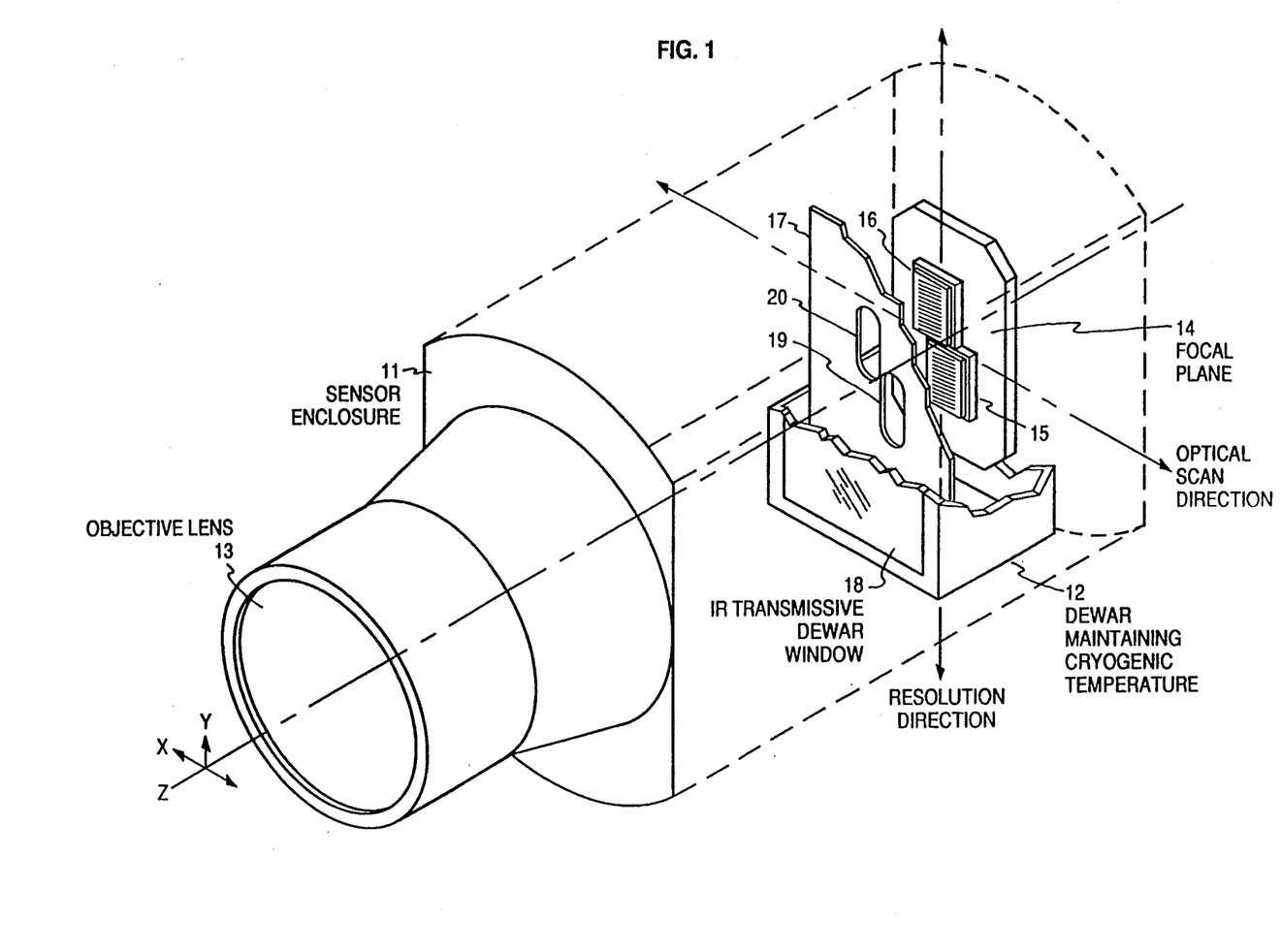
FIG. 1 illustrates a portion of the optical system within an IR sensor in which a novel three part cold shielding arrangement may be employed.

An IR sensor having improved cold shielding efficiency is illustrated in the simplified perspective view of FIG. 1.

The IR sensor of FIG. 1 is a portion of an IR imaging system in which means are provided for imaging successive narrow vertical angular sectors of a panoramic object field upon an IR sensor in the focal plane of the optics as the object field is azimuthally scanned. The scanning may be achieved by rotating the sensor field of view about a vertical axis parallel to the major axis of the linear array. In the process, the object field is read out, sector by sector. During this process a sequential electrical signal is obtained, suitable for reconstructing a two dimensional image of the object field. The scanning means and the reconstruction electronics may be of a conventional nature.

The IR optic includes an enclosure 11 for enclosing and supporting the optical system and a cryogenically cooled Dewar 12. In this optic, a focused image is formed by objective lens 13 upon the focal plane 14, which is here shown to include two linear arrays 15, 16 each having four columns of pixels. These arrays are aligned parallel to each other, but with their major axes offset to the right and left of a vertical (YZ) plane passing through the optical (Z) axis. The focal plane 14 is disposed within the Dewar 12, behind an IR transmissive Dewar window 18 and behind the slotted cold shield plate 17. Not illustrated in FIG. 1 is a spectral filter which is normally located between the slotted cold shield plate and the focal plane to define the sensor spectral response band. The optical elements as illustrated provide a system relative aperture of approximately F/2.0, though the present approach is not limited to this optical speed.

The optical elements are aligned upon and spaced along the (Z) optical axis as generally illustrated in FIG. 1. The optical scanning direction is parallel to the X axis, and the resolution direction is parallel to the Y axis as also illustrated in FIG. 1. Accordingly, the slotted cold shield 17 and the focal plane 14 are aligned in planes orthogonal to the optical (Z) axis and in relation to the optical scanning direction. The distance measured along the Z axis between the cold shield plate 17 and the focal plane 14 is illustrated larger than to scale in FIG. 1. In practice, that distance is approximately 100 mils with the slots 19, 20 being in the range of 100 to 400 mils in length, according to the selected IR array. The major axes of the elongated slots 19, 20 which define the axis of the cold shield 17, are offset from and parallel to that axis and are parallel to the Y axis. The major axis of the focal plane, which is also defined by the axes of its component linear arrays 15, 16, is also oriented parallel to the Y axis. Thus the resolution direction of the focal plane 14 is parallel to the Y axis and it is designed to be scanned in a direction parallel to the X axis. These relationships are as depicted in FIG. 1.

The enclosure 11 and the objective lens 13 at the front of the optic as a customary feature of the optical design will usually be maintained at ambient temperature (300K), while the focal plane 14 including the IR detector array (15, 16), is maintained at a cryogenic temperature (e.g. 65-70K) for sensitivity. To achieve these temperature differences, the array and slotted plate 17 are set within the dewar 12 and behind the IR transmissive window 18 in the dewar wall.

A natural consequence of this design is that the interior surfaces of the enclosure 11 and the surfaces of the objective lens, which are at a nominal 300K ambient temperature, become large sources of unfocused IR radiation. All unfocused IR radiation forms an undesirable background to any focused IR signal. As the ratio of the unfocused IR background to the focused IR signal increases, the signal to noise ratio is reduced, thereby reducing both the sensitivity and the dynamic range of the system.

The cold shielding measures are designed consistently with the relative aperture of the optical system (nominally F/2.0 in the present example) to reduce the amount of unfocused IR radiation originating within the sensor from impinging upon the IR detectors of the linear array.

The cooling of the focal plane 14 is achieved by setting it within the dewar 12 and using cryogenic coolers (not illustrated) behind the focal plane array. The focal plane is surrounded on its sides and back surface with cryogenically cooled surfaces which make a negligible contribution to the detector IR background level. The walls of the dewar, closed at the light incident end by the IR transmissive window 18, complete the enclosure surrounding the focal plane. The IR transmissive window 18 and spectral filter are designed to accept only that infrared waveband of interest.

In addition, the slotted plate 17, which is placed behind the window 18 and in front of the linear array, is maintained at cryogenic temperatures so that it produces a negligible contribution to the IR background level—but it admits both focused and unfocused IR through its slots.

The slotted plate 17 is designed to screen out most of the unfocused IR background, but only in the optical scan direction. As will be seen, additional cold shielding performance can be obtained with supplemental shielding proximate to the individual pixels. The slotted cold shield plate, which is adapted to provide shielding for the two linear arrays 15, 16 of the focal plane 14, has one slot 19 positioned to provide shielding for array 15 and second slot 20 positioned to provide shielding for array 16.

Figure 2:
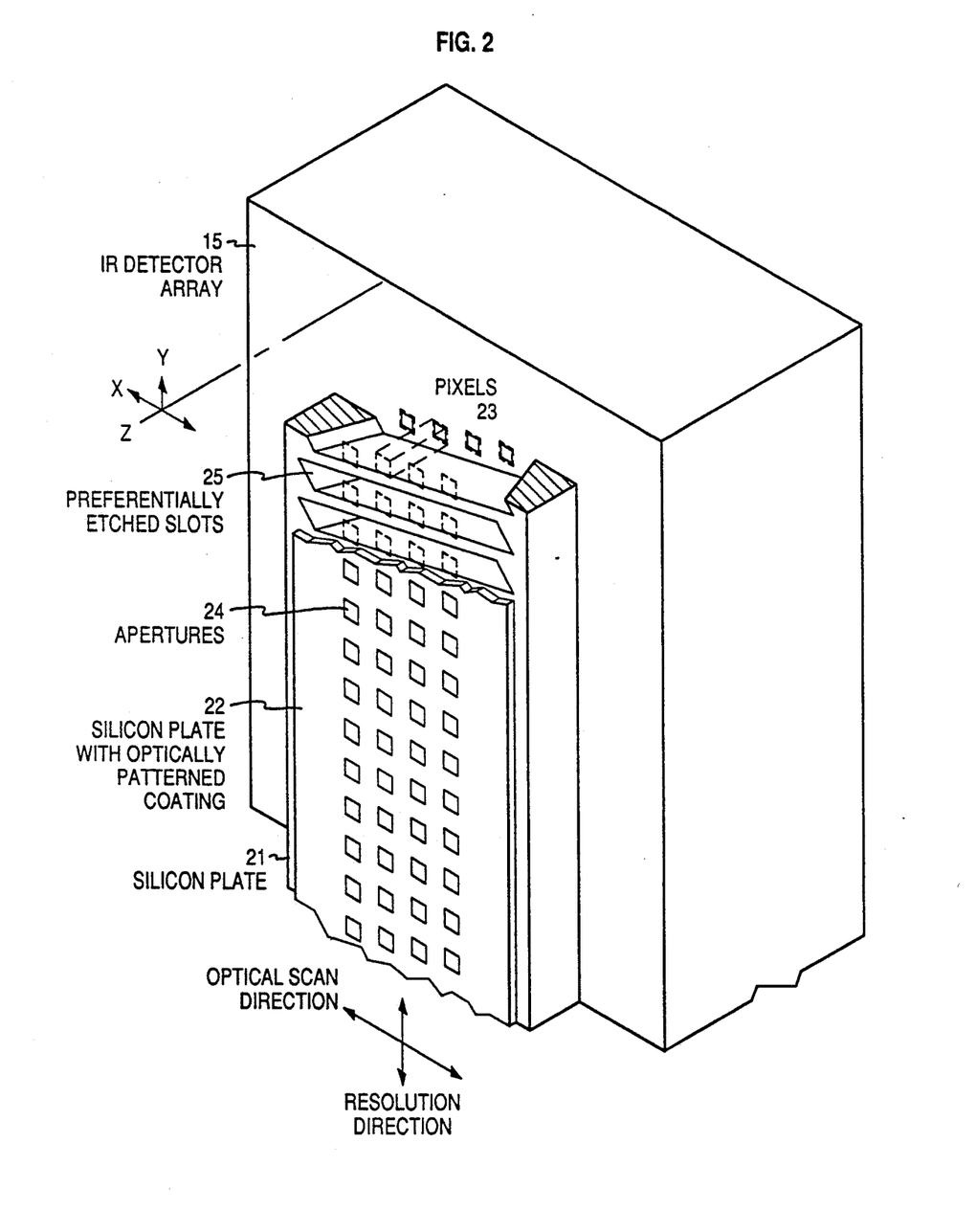
FIG. 2 is a cut-away isometric sketch drawn to illustrate the two part composite cold shields provided in proximity to the pixels of a linear array, the selected linear array illustrated with four closely spaced columns.

FIGS. 1 and 2 are drawn to illustrate application of the present pixel cold shielding invention to a specific focal plane array configuration. This focal plane array is assumed to be an assembly of two small-pixel linear arrays 15, 16 each having 256 pixels. Here the pixels are arranged in a four column staggered-pixel configuration to achieve a large pixel overlap (nearly 100%) on a small (nominal mil or sub-mil) pixel pitch. Thus, FIG. 2 shows the 256 pixels on this array in four columns of 64 pixels each with a relative stagger to achieve large pixel overlap.

The two arrays 15, 16 are mutually offset in the optical scan direction by an amount which also permits efficient cold shielding by the two slots 19, 20 and at a distance representinq a small fraction of the distance scanned during an integration time.

The slotted cold shield plate 17 is designed to intercept IR radiation exceeding a desired acceptance angle (or focused beam angular field) measured in the scanning direct and orthogonal to the axis of the array. Each of the slots (19, 20) performs this function for all the pixels in the associated linear array (15 or 16). The major axis of each slot is aligned upon a line midway between the four columns of pixels on each array. The ends of each slot are aligned with the ends of the pixels on each array to provide substantially equal shielding angles for the end pixels.

Figure 5A:
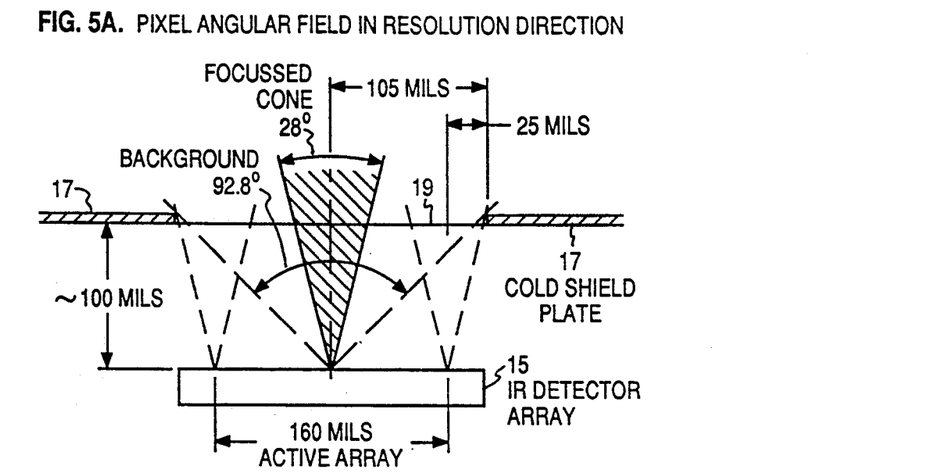
FIGS. 5A and 5B are views of the pixel angular field of view in the resolution (cross-scan) direction and in the optical scan direction attributable to the slots of the first cold shield plate, respectively.
Figure 5B:
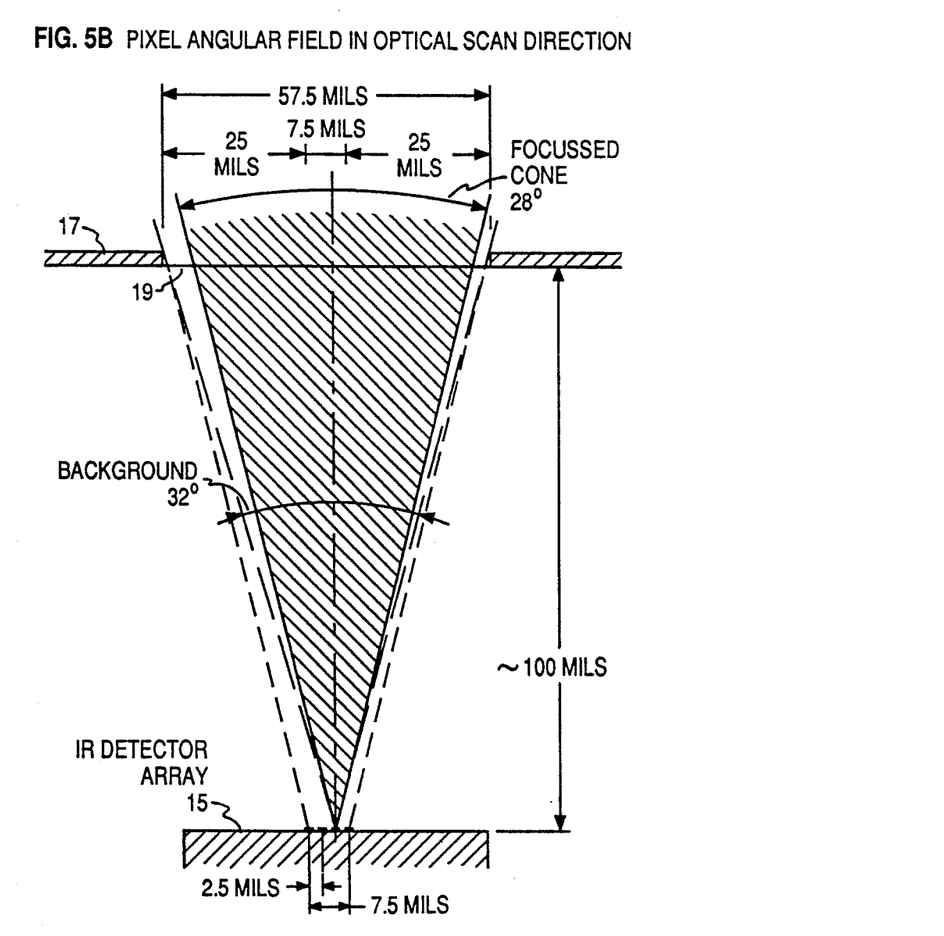

The limited cold shielding effectiveness of the slot in the cold shield plate 17 may be appreciated by reference to FIGS. 5A and 5B, which is drawn substantially to scale. This cold shield plate is designed to provide optimum acceptance of focused IR radiation while minimizing unfocused background radiation for only the optical scan direction. Assuming $F/\# = 2.0$, which corresponds to a focused cone whose central angle is approximately 28°, the slot width is set to provide an acceptance angle of no less than this amount for all the pixels of the associated array.

FIG. 5B shows the pixel angular field of view in the optical scan direction. Pixels in the array of FIG. 2 are disposed in four adjacent columns with the interval between columns being typically several mils here shown as 2.5 mils) and the distance between the slot and the array generally in the region of 80 to 100 mils. The aperture of the slot is widened slightly to allow a 28° focused cone for pixels in all four columns. This only increases the background angular field by about 4 degrees, beyond the optimum focused field of 28° for a single column of pixels.

The cold shielding efficiency in the scanning direction is maintained until one reaches the ends of a sub-array when multiple staggered arrays are used on a focal plane. The web between adjacent slots in a multiple array cold plate remains wide along the central portions of each array and thus provides efficient cold shielding action except at the very ends of the arrays where the web narrows as the slot for the adjacent array in a staggered position begins (as one proceeds in the direction of resolution).

Comparison of FIGS. 5A and 5B shows the slot cold plate provides effective cold shielding in the optical scan direction and poor cold shielding in the resolution direction. Note from FIG. 5B that the background (total) angular field is only 32 degrees for a focused angular field of 28 degrees or $28/32 = 87.5\%$ in the optical scan direction, but in the resolution direction the background angular field is much larger than the focused field. In the resolution direction the focused field to background (total) field is $28/92.8 \approx 30\%$. For the central pixel the effective cold shield efficiency of focused solid angle to total (background) solid angle is $CS = 26.4\%$.

As indicated in FIGS. 5A and 5B, the slotted cold shield plate 17 enhances cold shielding efficiency only in the optical scan direction. A composite, second and third, cold shield supported in proximity to the pixels, now to be described, provides substantial cold shielding efficiency improvement in the resolution direction and some minor improvement in the optical scan direction.

The two additional cold shield members 21 and 22, which are supported in close proximity to the array pixels, are seen in FIGS. 2 thru 5. The pixel proximate cold shields include a first plate 21 of silicon approximately 5 mils thick and spaced nominally one mil from the surface of the pixels, having a vertically (array resolution direction) spaced sequence of short preferentially-etched slots and a thinner silicon plate 22 supported upon the first plate, typically 25 microns (1 mil) thick and having an opaque coating on its upper surface. Each slot in the first plate confines the angular fields of view of each pixel of a row of four pixels in the resolution direction. An aperture is provided in the opaque coating of plate 22 for each pixel to further define its field of view in both the scan and resolution direction.

A cut-away perspective view showing the top of an IR detector array 15 (or 16) with the cold shields 21 and 22 in place is provided in FIG. 2. The array is of a suitable IR sensitive material such as InSb or MCT, with an array of pixels distributed upon its upper surface in the arrangement already described.

Figure 3:
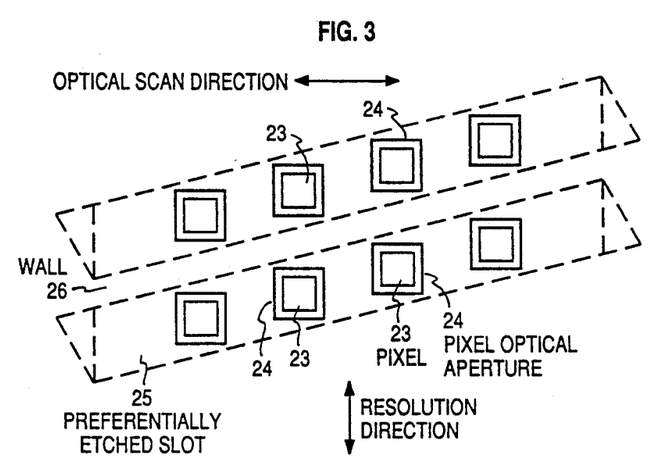
FIG. 3 is a plan view of the two part composite cold shields illustrating the relation of the slots in a first silicon member forming a first part of the composite cold shield to apertures patterned in an opaque layer applied to a thin silicon sheet forming the second part of the composite cold shield.

FIG. 3 shows a small group of the underlying pixels 23 of the array 15 in a plan view to show their distribution over the surface of the array. The figure also shows the boundaries of the slots 25 in the shield 21 and the apertures 24 in the shield 22. The pixels 23 are shown aligned in four columns. Successive pixels in the $n^{th}$ row of each column are offset in the resolution direction (Y dimension) by one quarter of the pixel interval measured along a single column in relation to the prior column. The first pixel in the next row ($(n+1)^{th}$ row) then commences at one quarter the pixel interval measured in the Y dimension beyond the 4th pixel in the $(n)^{th}$ row.

Figure 4:
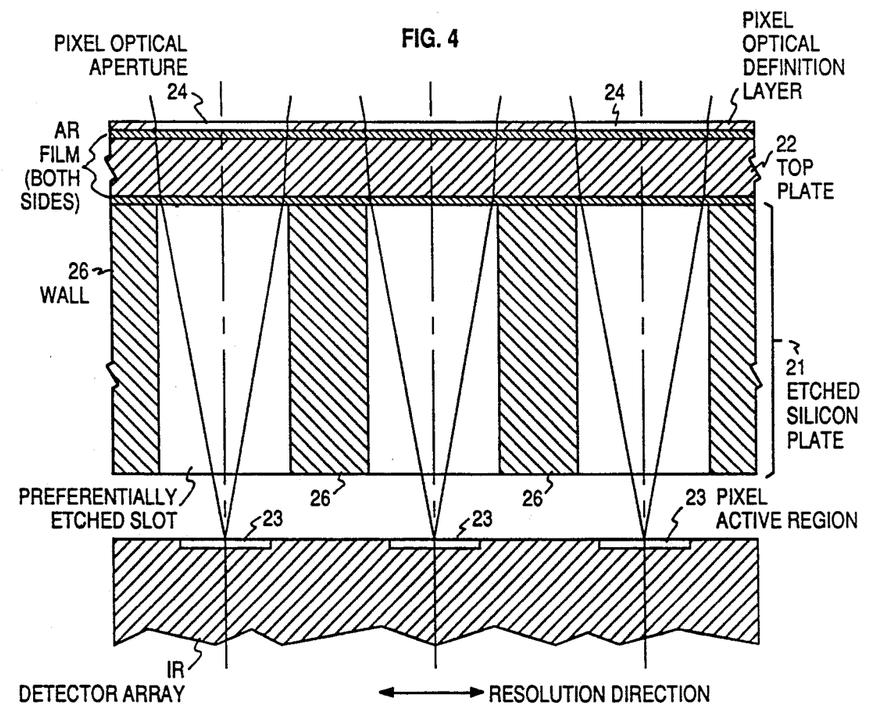
FIG. 4 is a cross-section view of the composite cold shield.

The foregoing arrangement of parallel columns, illustrates one of three reasons for increasing the width of a linear array which, as earlier stated, include TDI operation, the use of redundant pixels to permit selection of the best pixel, and to achieve a small pitch while allowing pixel overlap. The third purpose is illustrated by the staggered pixel arrangement of FIG. 3. By staggering the pixels in four columns, a four fold increase in resolution direction pixel-spacing is achievable over that of a single column of pixels of the same pitch. The minimum pixel interval achieved with the pixel cold shield as shown in FIG. 4 is determined by the thickness of the walls 26, which must be placed between each pixel, and the possible additional separation between the sensitive area of the pixel and the wall, that must be added. In FIG. 4, the sensitive area 23 of each pixel is 1.25 mils by 1.25 mils, and the interval between pixels is 2.5 mils. The walls 26 between pixels are nominally 1 mil thick and are skewed to the edges of the pixel as shown. The sensitive areas 23 of the pixels are centered in relation to the space between the walls.

The cold shielding effect of the two cold shields 21, 22 in the resolution direction is illustrated in FIG. 4. The sensitive area of the pixel is shown at 23. At the center of the sensitive region, the edges of the apertures 24 define the boundaries, in both the optical scan and resolution direction of an aperture, defining a cone having a half-angle of approximately 14°. The walls 26 between rows of pixels are designed to not obstruct the viewing angle established by the apertures of each pixel. In addition, the walls 26 prevent light entering a pixel from an adjacent row in the same column, and thus insure good pixel shielding in the resolution direction.

The cold shield aperture 24 dimensions represent a carefully chosen compromise between sensitivity and cold shielding efficiency.

In the scan direction, depending upon the separation of the pixels, the apertures 24 may also enhance the cold shielding of each pixel in the scan direction. The cold slot 19, shown in FIG. 5B, have to be wide enough to pass the focused 28° cone from all pixel column positions which forces the background angular field up to 32°. Pixel level cold shielding can hold the background field closer to 28° for all pixel column positions.

The novel cold shields 21, 22 provide a versatile means for cold shielding linear arrays in a variety of configurations. This variety includes both the case of a linear array using only a single column of pixels or cases where there are more than one column of pixels. The prior scheme utilized in U.S. Pat. No. 4,075,553 was particularly suited to an IR array in which there were no more than two columns of pixels. The present arrangement represents an extension which is not limited to two columns, but which may be used in linear arrays having more than two columns, such as the four column pixel configuration example illustrated in FIGS. 2, 3, 4 and 5 or the 16 column example of FIG. 6.

The major advantage of the presently disclosed pixel level cold shielding means is in improving the cold shielding when a long linear array is of substantial width and the slotted cold shield thereby loses cold shielding efficiency.

In general the cold shields 21 and 22 which are proximate to the individual pixels, and which govern the acceptance angle of either single pixels or several pixels in a common position in one of several columns permit an improvement in cold shielding efficiency over other known means because of the ability to form very finely patterned surfaces in properly oriented silicon and in opaque coatings using photolithographic techniques. This ability is equivalent to the ability with which the individual pixel sites are patterned and may entail features defined to the micron level.

The slotted pixel shield 21 is formed of oriented silicon, typically 5 mils in thickness, which is subject to patterned etching, to form the slots 25. The process can produce vertical side walls of high accuracy except at the ends of the slots where the walls become oblique. To avoid compromising the shielding at the ends of each slot—the slots are extended beyond the pixel sites by a great enough distance to present vertical surfaces to all rays likely to impinge on the sensitive area of the pixel. The robustness of the shield is also increased if the width of the silicon shield 21 extends significantly past the ends of the etched slots. To further enhance the performance of the shield 21 the slots are blackened with an opaque, low-reflective coating, such as a metal oxide films, for example copper or chrome oxide. Present etching techniques permit wall thicknesses as small as 1 mil or less between slots on the silicon shield 21.

The apertured shield 22 is a thin silicon sheet to which an opaque coating subject to high resolution patterning has been applied. Optical patterning of the coating entails the formation of square apertures approximately 1.5 to 2 mils on a side. Suitable opaque coatings are commercially available in the form of metal oxide films or "dark mirror" multilayer interference films.

Figure 6:
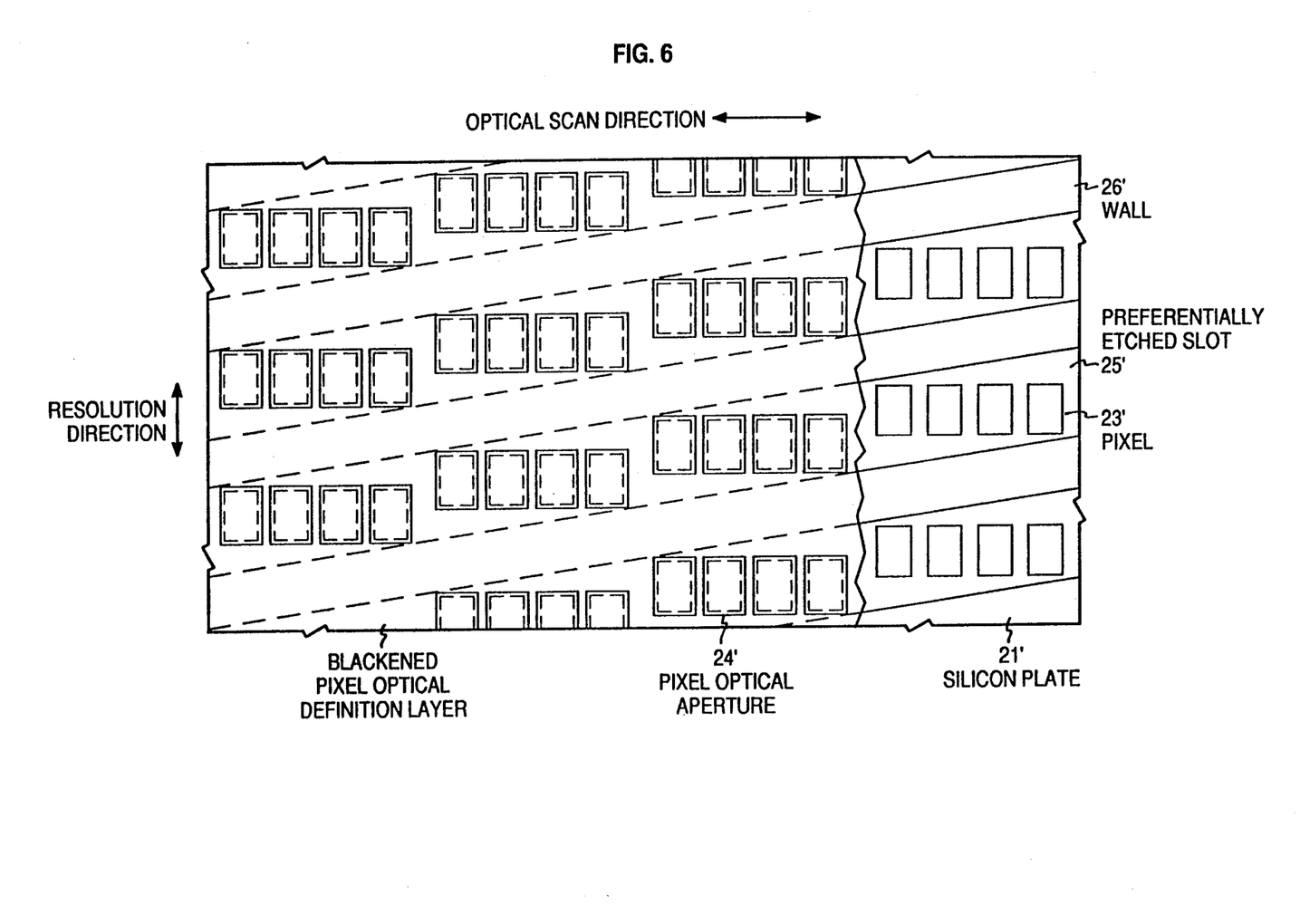
FIG. 6 is a plan view of the disposition of the two parts of the composite cold shield in relation to a selected quadralinear, four deep linear TDI array; which is an example of a wider linear array which consists of 16 columns of pixels forming a 4×480 element array.

The invention may also be applied to a "linear" array of greater complexity than hitherto disclosed such as that shown in FIG. 6. Here an array is shown, which is nominally characterized as a 4 deep × 480 element array. This quadrilineal configuration has 4 groups of 4 deep TDI pixels. These pixels are arranged in sets of 16 between the etched walls of a pixel proximate slotted shield corresponding to the shield 21 of FIG. 2. There are 480/4=120 etched slots 25 in the silicon plate 21. Here each $n^{th}$ position in a column includes four sets of pixels at each resolution position and set of four TDI pixels at each resolution position. In this array the individual pixels are shown as being 1.5×2.25 mils in optical scan and resolution dimensions respectively, with successive sets of four being offset 1.5 mils in the resolution dimension, with the distance between columns in the scanning dimension being 1.5 mils. The walls 26 of the slotted plate 21 are at most 2.25 mils thick and the slot 25 formed between walls is approximately 3.5 mils wide. The apertured plate 22, not shown, and assuming the presence of the shield 17, may replicate the pixel sites with a slight magnification. Accordingly the aperture in the shield 22 directly over the selected pixel defines the field of view of the selected pixel in both the scan and resolution dimension.

What is claimed is:

1. In an IR sensor for a scanned linear array having a predetermined optical scanning direction and a predetermined resolution direction, a combination providing improved cold shielding efficiency, comprising:
   (A) an enclosure normally maintained at ambient temperature, having an aperture for admitting IR radiation and containing optical means for focusing IR image radiation entering said aperture upon a focal plane;
   (B) a cryogenically cooled, evacuated dewar for enclosing said focal plane, said dewar having an IR transparent window;
   (C) a linear IR detector array positioned at said focal plane with said dewar, an axis of the array, which is coincident with the resolution direction being oriented orthogonal to the scanning direction, the linear array including more than two columns of pixels disposed parallel to the axis of the array; and
   (D) cold shielding means installed within said dewar for reducing the amount of unfocused IR radiation impinging of said array, comprising
      (1) a first cold shield comprising an elongated slot spaced from said linear array to intercept radiation exceeding the focused pixel angular field measured in the scanning direction for the pixels in each column, and (2) a second and a third cold shield supported between the first cold shield and the focal plane in proximity to the pixels in said linear array, (a) the second shield having successive walls disposed between pixels at successive row positions in said columns erected on a surface proximate to the plane of said pixels for defining openings between the walls, the walls being sufficiently high in relation to the pixel width to exclude radiation significantly exceeding the focused pixel angular field measured in the resolution direction, and (b) the third shield including an apertured plate, having one aperture for at least one pixel all in the same optical scan direction, disposed between the first cold shield and the second cold shield and aligned with the openings between said walls to reduce radiation exceeding the focused pixel angular field in the resolution direction, said first, second and third cold shields restricting the angular fields at each pixel to optimize the ratio of focused image radiation entering said aperture to unfocused IR radiation from said enclosure.

2. The combination set forth in claim 1, wherein said second shield includes a silicon plate containing a preferentially etched slot for each of said rows, each slot restricting the angular fields in the resolution direction for the pixels in that row which prevents admission of radiation from apertures for pixels in adjacent rows.

3. The combination set forth in claim 2, wherein said third shield is a thin layer of silicon having an apertured IR opaque coating.

4. The arrangement set forth in claim 1, wherein said third shield is provided with an aperture for each pixel for reducing radiation in both the resolution and scanning direction, said first shield preventing IR radiation from other than the associated aperture from impinging on a pixel.

5. The arrangement set forth in claim 1, wherein said third shield is coated with anti-reflective films on both surfaces.

6. The arrangement set forth in claim 5, wherein the walls of said second shield are coated with low reflectance film.

7. The combination as in claim 1, wherein one column includes more than one pixel at each row position and the corresponding row position of an adjacent column includes more than one pixel and is physically staggered with respect to the one column in the resolution direction.

8. The combination as in claim 7, wherein there are four columns, each column having one-hundred twenty rows and including four pixels at each row position.

9. The combination as in claim 1, wherein one column includes at least one pixel at each row position and the corresponding row position of an adjacent column includes at least one pixel that is physically staggered with respect to the one column in the resolution direction.

* * * * *